United States Patent [19]
Furuhata

[11] Patent Number: 5,341,004
[45] Date of Patent: Aug. 23, 1994

[54] SEMICONDUCTOR SWITCHING DEVICE WITH REDUCED SWITCHING LOSS

[75] Inventor: Shoichi Furuhata, Kawasaki, Japan

[73] Assignee: Fuji Electric Co. Ltd., Kanagawa, Japan

[21] Appl. No.: 843,244

[22] Filed: Feb. 28, 1992

[30] Foreign Application Priority Data

Mar. 8, 1991 [JP] Japan .................................. 3-043378

[51] Int. Cl.[5] .................... H01L 29/74; H01L 31/111; H01L 29/00
[52] U.S. Cl. ..................................... 257/139; 257/138; 257/537; 257/539; 257/140
[58] Field of Search ................ 257/139, 138, 537, 538, 257/539

[56] References Cited

U.S. PATENT DOCUMENTS

| | | | |
|---|---|---|---|
| 4,404,658 | 9/1983 | Ports | 257/538 |
| 4,472,642 | 9/1984 | Akamatsu | 257/138 |
| 5,097,302 | 3/1992 | Fujihira et al. | 257/139 |

FOREIGN PATENT DOCUMENTS

| | | |
|---|---|---|
| 0181148 | 5/1986 | European Pat. Off. . |
| 2164790 | 5/1986 | European Pat. Off. . |
| 0430237 | 6/1991 | European Pat. Off. . |

Primary Examiner—Rolf Hille
Assistant Examiner—Wael Fahmy
Attorney, Agent, or Firm—Spencer, Frank & Schneider

[57] ABSTRACT

A semiconductor switching device including a first IGBT and a second IGBT connected in parallel The first IGBT has a low saturation voltage and a long fall time, whereas the second IGBT has a high saturation voltage and a short fall time. An input resistor is connected to the gate of the second IGBT, and a common drive signal is applied to a gate of the first IGBT, and to a gate of the second IGBT through the input resistor. The cutoff of the second IGBT is delayed when the first and second IGBTs are driven by the common drive signal so that the semiconductor switching device is turned off in the short fall time of the second IGBT. The switching speed is increased and the switching loss is decreased. Only a single drive circuit is enough for driving the device, enabling the miniaturization and low cost of the driving circuit.

10 Claims, 8 Drawing Sheets

SEMICONDUCTOR SWITCHING DEVICE WITH REDUCED SWITCHING LOSS

BACKGROUND OF THE INVENTION

1. Field of the Invention

The present invention relates to a semiconductor switching device, and particularly to a large current capacity switching device having a reduced switching loss.

2. Description of the Prior Art

Semiconductor switching devices are extensively used in power supplies for microwave ovens, induction heating power supplies for electromagnetic cooking apparatus, uninterrupted power supplies, or the like. These semiconductor switching devices typically use semiconductor switching elements such as bipolar transistors (BJTs) and insulated gate bipolar junction transistors (IGBTs) because of their large current capacity and low saturation voltages. These semiconductor elements are controlled by driving circuits connected to gates of the IGBTs or bases of the transistors to turn on and off electric current at predetermined frequencies.

To reduce power consumption of these switching devices using the BJTs or IGBTs, it is of great importance to reduce switching loss of the semiconductor switching elements.

Figure 1:
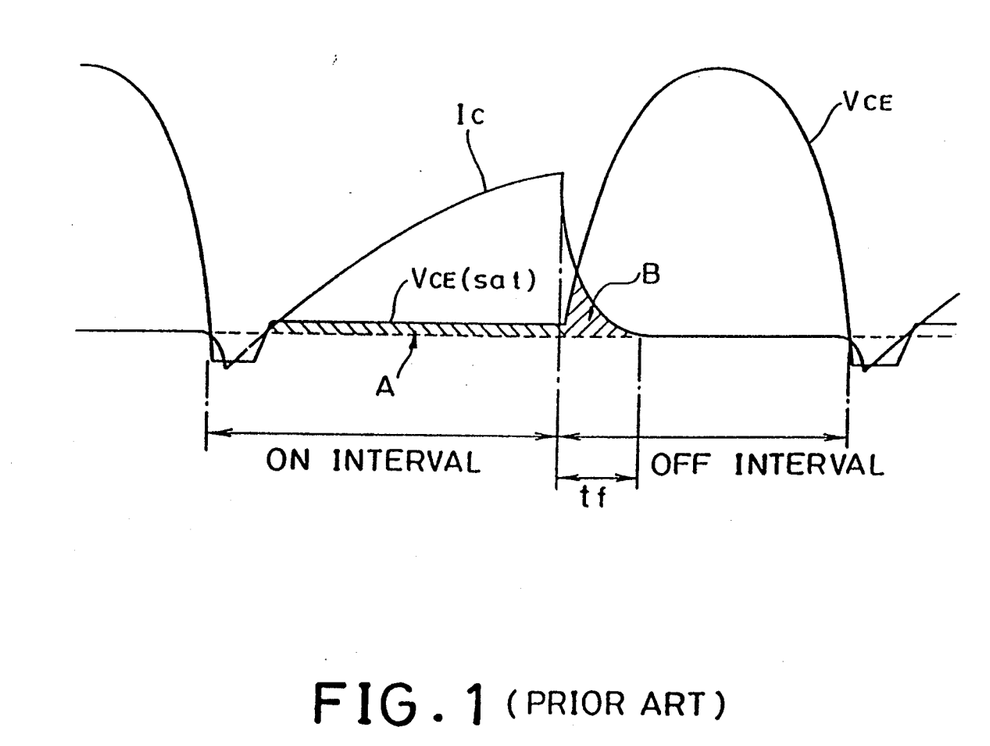
FIG. 1 is a timing chart illustrating an operation of a conventional switching device applied to a power supply for an induction heating apparatus.

FIG. 1 is a diagram illustrating a switching characteristic of a switching device for an induction heating power supply in which an IGBT is driven by a driving circuit. In FIG. 1, Ic is a collector current of the IGBT, $V_{CE}$ is a collector-to-emitter voltage of the IGBT. During the on-interval during which a positive potential is applied to the gate of the IGBT, a large amount of current flows through the IGBT, and the on-state voltage (called the saturation voltage hereinafter) $V_{CE(sat)}$ is low. In contrast, during the off-interval in which a negative potential is applied to the gate, the current is interrupted. Thus, in FIG. 1, the IGBT is periodically driven with the on-interval of approximately 30 μs, and the off-interval of approximately 20 μs. Here, the consumption power involved in the switching of the IGBT, namely, the switching loss of the IGBT, corresponds to shaded areas of FIG. 1: The power consumption corresponding to a shaded area A is a turn-on loss determined by the saturation voltage $V_{CE(sat)}$, and the power consumption corresponding to a shaded area B is a turn-off loss determined by a tail portion of the current waveform of the IGBT. Currently, the turn-off loss B accounts for a larger percentage of the switching loss, and hence, reduction of the turn-off loss B brings about the improvement of the power efficiency. The turn-off loss B can be reduced by shortening the fall time $t_f$ of the IGBT.

The shortening of the fall time $t_f$ of minority carrier devices such as IGBTs and BJTs, however, generally increases the saturation voltage $V_{CE(sat)}$. In other words, there is a trade-off between the fall time $t_f$ and the saturation voltage $V_{CE(sat)}$. Therefore, there is also a trade-off between the turn-off loss and the turn on-loss, and hence, the reduction in the switching loss is restricted within a certain limit by inherent characteristics of the device elements.

Figure 2:
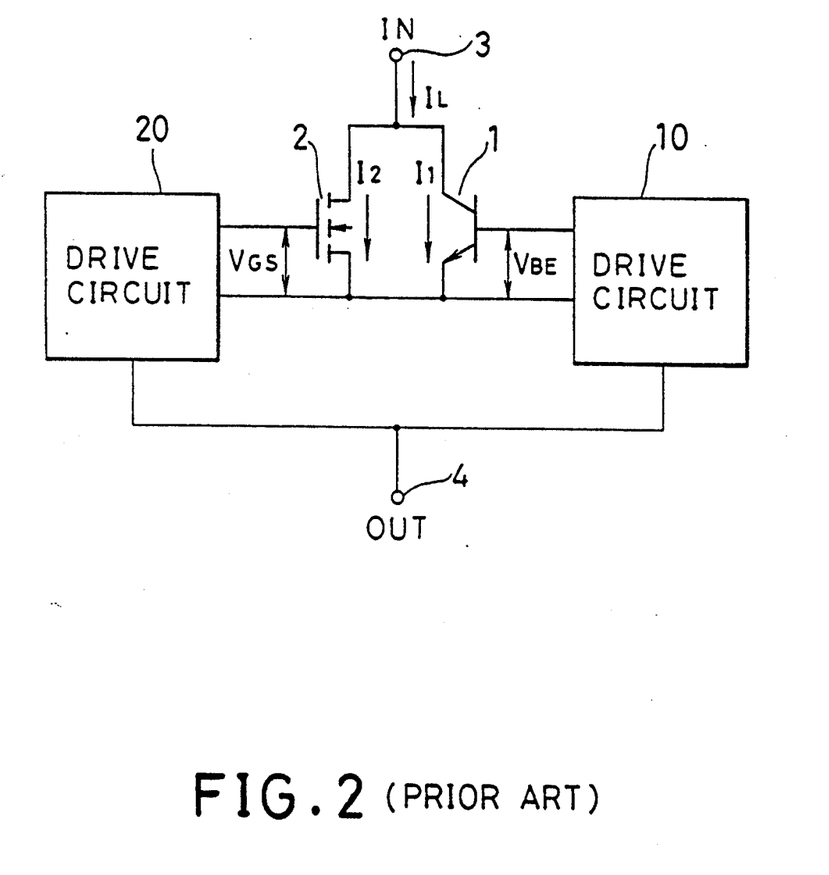
FIG. 2 is a circuit diagram showing an arrangement of a conventional switching device combining a BJT and a MOSFET.
Figure 3:
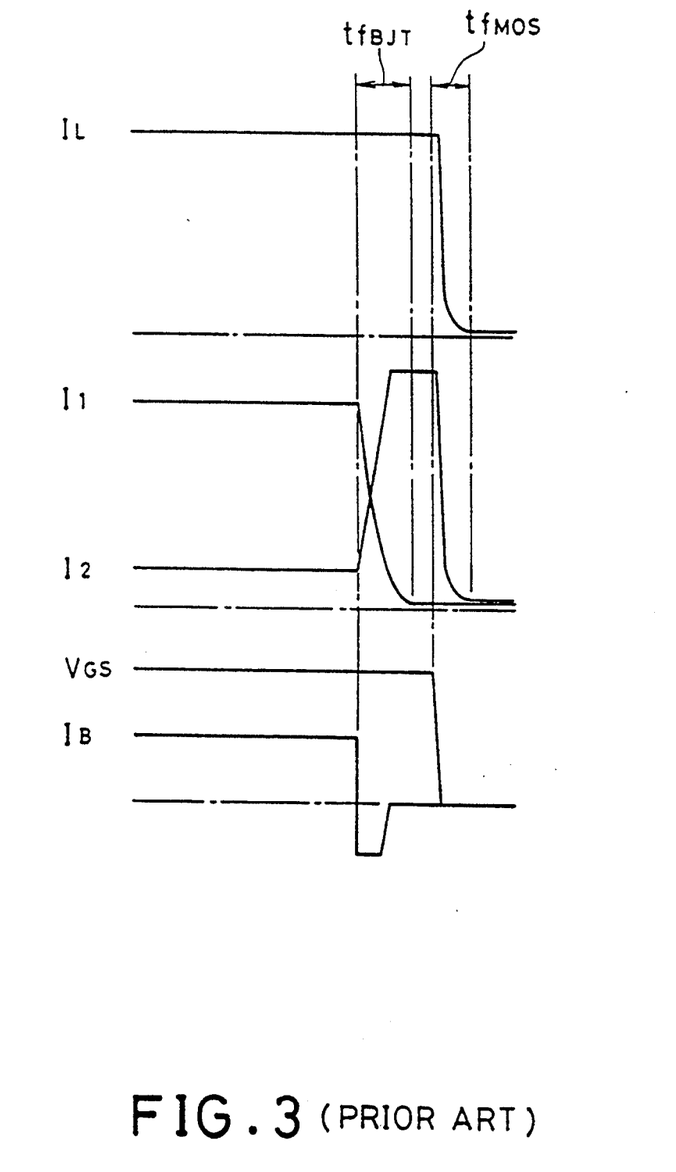
FIG. 3 is a timing chart illustrating the operation of the conventional switching device shown in FIG. 2.

One of the conventional techniques to decrease the turn-off loss with restricting the turn-on loss is shown in FIG. 2. In FIG. 2, a BJT (Bipolar Junction Transistor) 1 is connected in parallel with a high speed MOSFET 2. The BJT 1 is driven by a drive circuit 10 and the MOSFET 2 is driven by a drive circuit 20 so that an input terminal 3 is connected with or disconnected from an output terminal 4. When the device is turned off in this arrangement, the base current $I_B$ of the BJT 1 is cut off prior to the gate voltage $V_{GS}$ of the MOSFET 2, as shown in FIG. 3, so that the collector current $I_1$ of the BJT 1 drops previous to the drain current $I_2$ of the MOSFET 2. Thus, the load current $I_L$ of the device is interrupted at a high speed corresponding to the fall time $tf_{MOS}$ of the MOSFET 2, which is shorter than the fall time $tf_{BJT}$ of the BJT 1.

The BJT 1 and the MOSFET 2, however, are basically different drive mode devices: a current drive device and a voltage control device, respectively. For this reason, a single drive circuit is not enough to establish necessary cutoff timing between the BJT 1 and the MOSFET 2: two drive circuits 10 and 20 are needed, thereby complicating the circuit and increasing the occupied area of the device.

SUMMARY OF THE INVENTION

Accordingly, it is an object of the present invention to provide a semiconductor switching device of a low switching loss and of small dimensions with simple construction.

The present invention provides a semiconductor switching device including:

a first semiconductor element having an input electrode, an output electrode, and a control electrode to which a drive signal is applied to connect the input electrode to the output electrode or to disconnect the output electrode from the input electrode;

a second semiconductor element connected in parallel with the first semiconductor element, and having a control electrode to which the drive signal is applied, the second semiconductor element being of the same type semiconductor device as the first semiconductor element, and having higher saturation voltage and shorter fall time than the first semiconductor element; and a drive signal delay device for delaying the drive signal applied to the control electrode of the second semiconductor element by a greater amount than the drive signal applied to the control electrode of the first semiconductor element.

Here, the drive signal delay device may be an input resistor which is connected to the control elect rode of the second semiconductor element, and which has larger resistance than an input resistor connected to the control electrode of the first semiconductor element.

The drive signal delay device may be an input charge quantity associated with the control electrode of the second semiconductor element, the input charge quantity being larger than that associated with the control electrode of the first semiconductor element.

The first semiconductor element and the second semiconductor element may have each active device area on a common semiconductor substrate, and the control electrodes are interconnected through a resistance layer.

The first and second semiconductor element may be a pair of IGBTs.

The first and second semiconductor elements may be a pair of bipolar transistors.

The first and second semiconductor elements may be a pair of MOSFETs.

The first semiconductor element may include an insulating layer formed under its control electrode, and the second semiconductor element may include an insulating layer formed under its control electrode, and at least a part the insulating layer of the first semiconductor element may be thicker than the insulating layer of the second semiconductor element.

The active device area of the second semiconductor element may be subjected to minority carrier lifetime shortening process for a longer duration than the active device area of said first semiconductor element.

According to the present invention, since the first semiconductor element and the second semiconductor element are connected in parallel, the low saturation voltage of the first semiconductor element determines the on-state voltage of the semiconductor switching device during the on-state interval. Accordingly, the turning-on loss of the switching device can be restricted to such a degree as when the first semiconductor element is used alone as a switching device. On the other hand, during the turn-off interval, since the drive signal is applied to the control electrode of the first semiconductor element prior to the control electrode of the second semiconductor element, the current drop accompanying the voltage drop of the control electrode of the first semiconductor element precedes. In this state, the current transfers to the second semiconductor element so that the total amount of the current changes little and the voltage drop does not increase much. Subsequently, the second semiconductor element enters turn-off action, and the current drops in a short fall time of the second semiconductor element so that the semiconductor switching device transfers to the nonconductive state. Therefore, the turn-off loss can be restricted to such an amount as when the second semiconductor element is used alone as a switching device. Thus, both turn-on loss and turn-off loss can be reduced by utilizing the advantageous characteristics of the first and second semiconductor elements. That is, by using the low saturation voltage of the first semiconductor element and the short fall time of the second semiconductor element, the saturation voltage and the fall time being in the tradeoff relationship in a single semiconductor device. Since the first and second semiconductor elements are of the same type, such as a pair of IGBTs or a pair of BJTs, and the drive signal delay device is incorporated into the device, a single signal can drive both the first and the second semiconductor elements. Therefore, sufficient effect can be achieved by a single drive circuit, resulting in simplification of the circuit configuration of the device and in reduction in the occupied area of the device.

The drive signal applied to the control electrode of the second semiconductor element can be delayed by making the input resistor connected to the control electrode of the second semiconductor element larger than the input resistor connected to that of the first semiconductor element because the voltage drop across the larger input resistor can substantially delay the drive signal.

The above-mentioned effect can be achieved when the first and second semiconductor element are either a pair of BJTs or a pair of IGBTs. With IGBTs, in particular, the drive signal delay device can be provided in the form of the larger charge quantity of the control electrode (the gate) of the second semiconductor element than that of the first semiconductor element. In this case, even when the drive signals applied to both control electrodes (both gates) change simultaneously, the potential drops of both control electrodes disagree because of the difference in the charge quantities of the control electrodes, resulting in effect similar to that of the input resistor above.

Forming active device areas of the first and second semiconductor elements on a common substrate together with connecting the control electrode by way of the resistance layer enables the switching device to be formed in a chip. In addition, the first and second semiconductor elements can share the entire or a part of the fabrication process because the two devices have the same structure, thus reducing the fabrication cost of the switching device.

In particular, the charge quantity of the control electrode of the first semiconductor element can be reduced by making at least a part of the gate insulating layer thicker than that of the second semiconductor element in the IGBTs.

Furthermore, the minority carrier lifetime control, which is added to the active device area of the second semiconductor element in order to shorten the lifetime of the minority carriers of the second semiconductor element than that of the first semiconductor element, makes it possible to specify the combination of the fall time and the saturation voltage in a broad range with high controllability.

The above and other objects, effects, features and advantages of the present invention will become more apparent from the following description of the embodiments thereof taken in conjunction with the accompanying drawings.

DETAILED DESCRIPTION OF PREFERRED EMBODIMENTS

The invention will now be described with reference to the accompanying drawings.

EMBODIMENT 1

Figure 4:
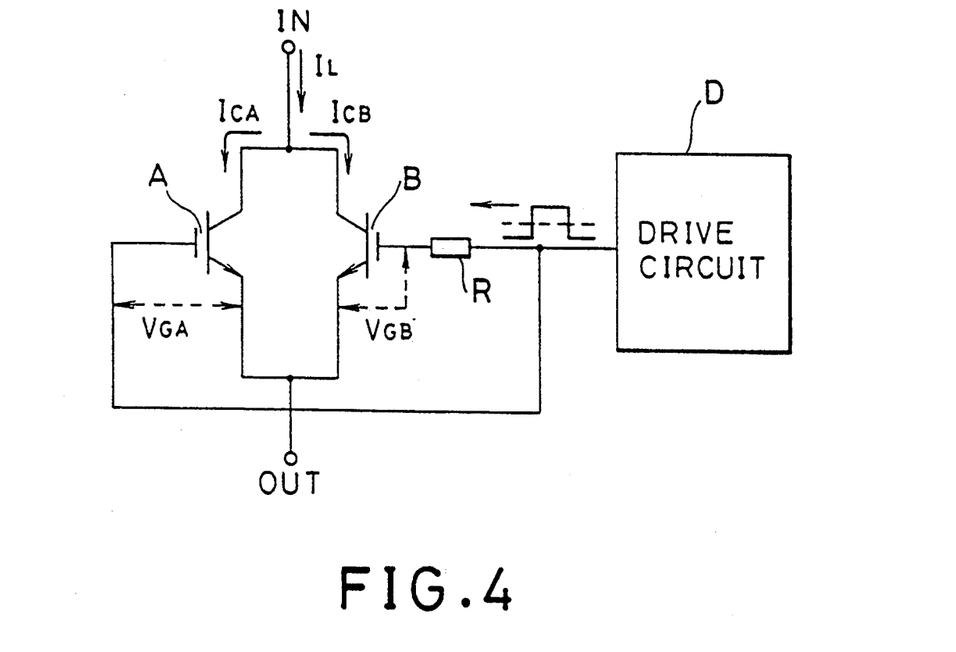
FIG. 4 is a circuit diagram showing an arrangement of a first embodiment of a semiconductor switching device according to the present invention.

FIG. 4 is a circuit diagram showing an arrangement of a first embodiment of a semiconductor switching device according to the present invention. This embodiment includes a pair of IGBTs A and B connected in parallel: their collectors are interconnected and their emitters are also interconnected. The IGBTs A and B are driven by a common drive circuit D. The output of the drive circuit D is directly applied to the gate of the IGBT A, whereas it is applied to the gate of the IGBT B through an input resistor R. Although the IGBT A may be provided with an input resistor connected between its gate and the output of the drive circuit D, the value of the input resistor of the IGBT A must be smaller than the input resistor R of the IGBT B.

Figure 8:
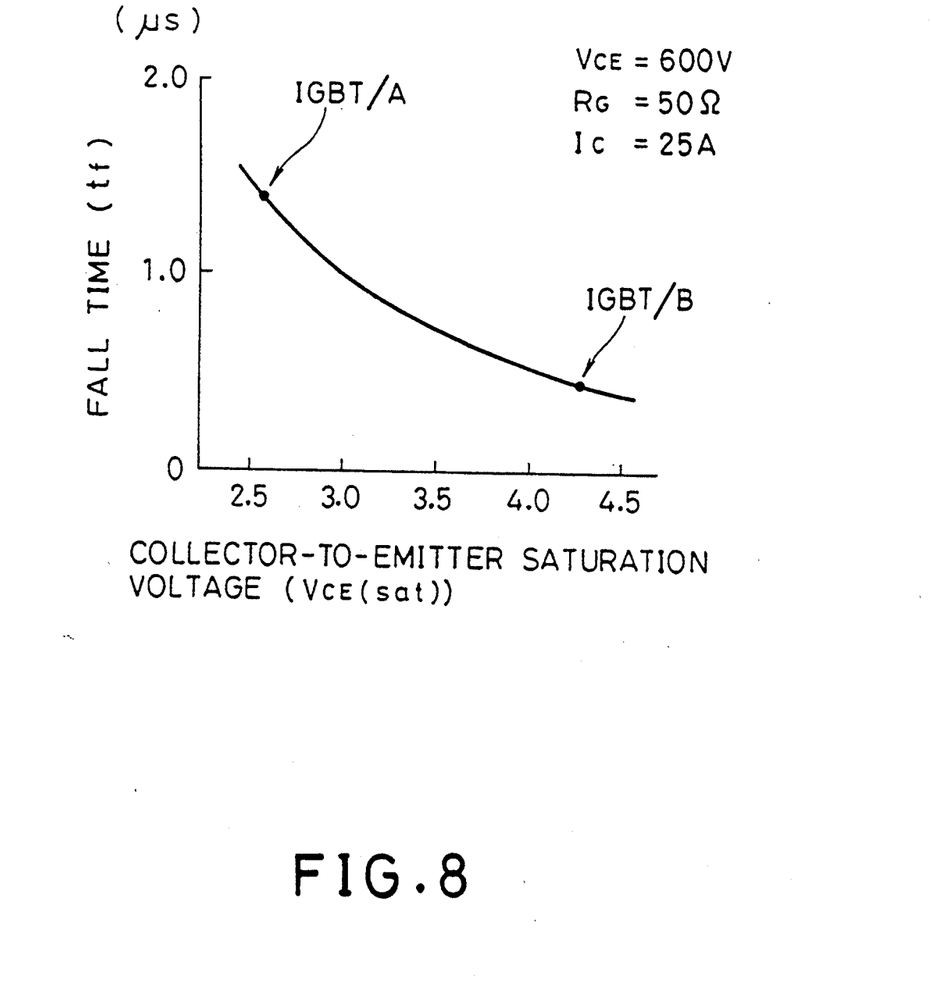
FIG. 8 is a graph illustrating the relationship between the fall time and the saturation voltage of IGBTs of the first embodiment.

FIG. 8 is a graph illustrating a tradeoff relationship between the saturation voltage $V_{CE(sat)}$ and the fall time $t_f$ of an IGBT. The IGBTs A and B are formed such that they have characteristics indicated by points A and B on the curve of FIG. 8: the IGBT A has a low saturation voltage of about 2.6 V and a long fall time of about 1.4 $\mu s$; whereas the IGBT B has a high saturation voltage of about 4.3 V and a short fall time of about 0.4 $\mu s$. These characteristics can be changed by controlling the on state voltage drop and/or sweep out efficiency of the minority carries by changing the following factors: spacing between the gates; channel length; thickness of the n-base layer; modification of structure such as doping concentration of an n-buffer layer adjacent to the n-base layer; and the lifetime of minority carriers.

Figure 5:
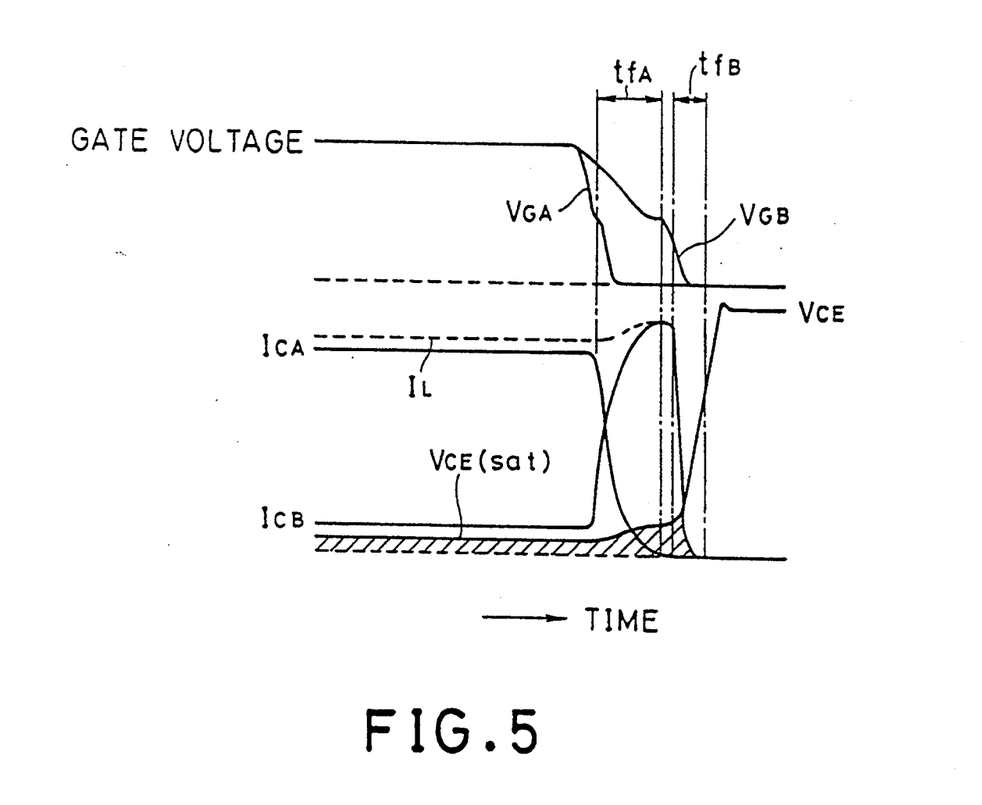
FIG. 5 is a timing chart illustrating the switching operation of the first embodiment.

FIG. 5 illustrates a driven state of the semiconductor switching device focusing on its turn-off operation. During the on-state interval in which a high potential is applied from the drive circuit D, the load current $I_L$ flows with the low saturation voltage $V_{CE(sat)}$ of the IGBT A. When the drive voltage of the drive circuit D begins to fall in this state, the gate voltage $V_{GA}$ of the IGBT A begins to drop prior to the gate voltage $V_{GB}$ of the IGBT B which is delayed by the voltage drop across the input resistor R. Thus, the collector current $I_{CA}$ of the IGBT A begins to drop after the short storage time accompanying the minority carrier removal, and the IGBT A enters into the off-state after the fall time $t_{fA}$ has elapsed. On the other hand, the collector current $I_{CB}$ of the IGBT B begins to increase with the decrease of the collector current $I_{CA}$, and then, turns to decrease after the decreasing delay time of the gate voltage $V_{GB}$. Thus, the IGBT B is turned off after its fall time $t_{fB}$. When the drive signal of 20–30 kHz is used, the effect of the long fall time $t_{fA}$ of the IGBT A can be almost completely eliminated in the case where the fall time $t_{fA}$ of the IGBT A is set at about 1 $\mu m$, the fall time $t_{fB}$ of the IGBT B is set at about 50–100 ns, and the turn-off starting time difference is set at 1 $\mu m$ or little more than that. This makes it possible to sharply reduce the turn-off loss of the embodiment than that of switching of a single IGBT A.

In this embodiment, one drive circuit D is enough to drive the two elements, IGBT A and IGBT B, because the two are the same type semiconductor elements having corresponding structure. In addition, since the input resistor R is enough for setting the turn-off timing of the two elements, the entire circuit configuration becomes very simple, thus shrinking the occupied area. As a result, the fabrication cost of the device can be sharply reduced.

Although IGBTs are used as semiconductor elements in this embodiment, the two elements can be replaced by a pair of the same type semiconductor elements, like a pair of BJTs or a pair of MOSFETs, as long as their saturation voltages $V_{CE(sat)}$ and fall times $t_f$ are controllable during the fabrication process. The above effects, however, are remarkable when the two elements are minority carrier devices, such as a pair of BJTs or a pair of IGBTs, which have tradeoff relationship between the saturation voltage $V_{CE(sat)}$ and the fall time $t_f$.

Although a waveform of the drive signal outputted from the drive circuit D is arbitrary, a certain waveform can produce greater effect: for example, a waveform including a reverse bias for reducing the turn-off loss; or a waveform for preventing an overdriving to reduce the turn-off loss.

EMBODIMENT 2

Figure 6:
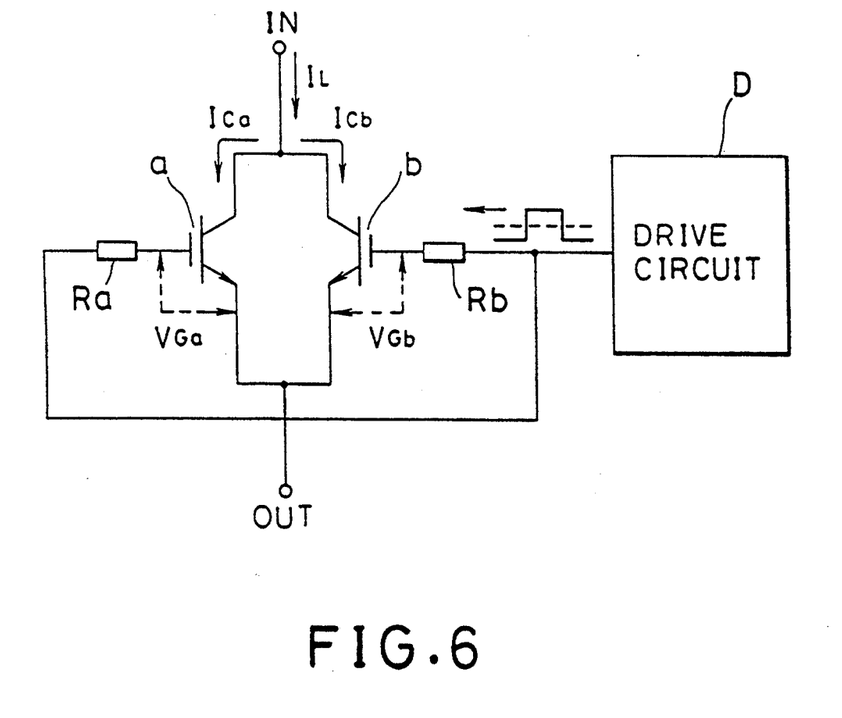
FIG. 6 is a circuit diagram showing an arrangement of a second embodiment of a semiconductor switching device according to the present invention.
Figure 7:
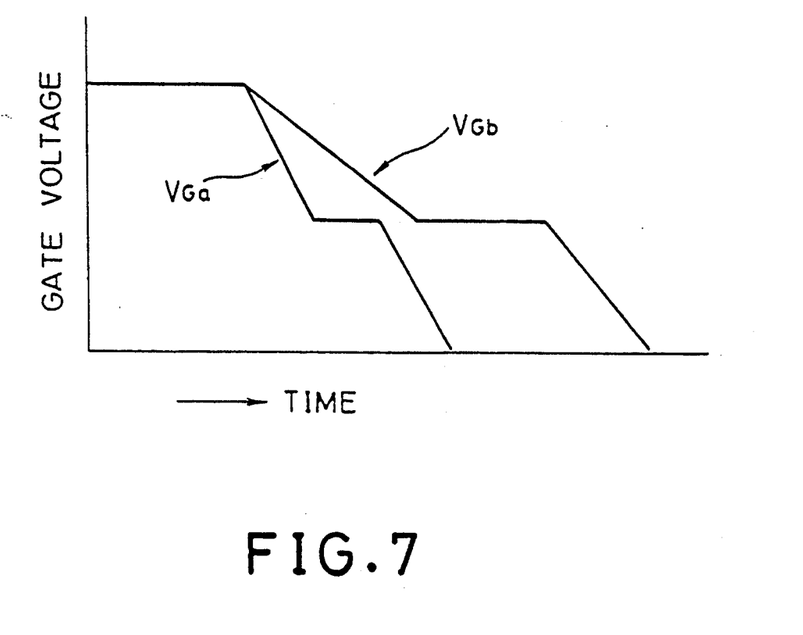
FIG. 7 is a graph illustrating gate voltage changes of the second embodiment.

FIG. 6 is a circuit diagram showing a second embodiment of a semiconductor switching device according to the present invention. As in the first embodiment, a pair of IGBTs a and b are connected in parallel, and resistors Ra and Rb are connected between the output terminal of a drive circuit D and gates of the IGBTs a and b, respectively. Although the second embodiment is similar to the first embodiment in that the IGBT a has a low saturation voltage and a long fall time, whereas the IGBT b has a high saturation voltage and a short fall time, the second embodiment is different in that a gate input charge quantity of the IGBT a is made smaller than that of the IGBT b. Here, the gate input charge quantity is a charge quantity stored in the gate capacitance during the on/off operation by the drive signal, that is, the integral of the gate capacitance, which is a function of the gate voltage, with respect to the gate voltage in the range from the off-state drive voltage to the on-state drive voltage. Changing the gate input charge quantity enables the gate voltage $V_{Ga}$ of the IGBT a to drop more quickly than the gate voltage $V_{Gb}$ of the IGBT, as illustrated in FIG. 7, even if the drive signals applied to the gates of the IGBTs a and b from the drive circuit D are identical. As a result, effect similar to that of the first embodiment can be achieved even if values of the input resistors Ra and Rb are equal.

The gate input charge quantity can be changed by altering thickness of a gate insulating layer, by changing areas of a gate and/or channel, or by modifying the dielectric constant of the gate insulating layer. A combination of the first and the second embodiment is also possible: not only the input resistors Ra and Rb are set at different values, but also the gate input charge quantities of the IGBTs a and b are set different. Thus, optimum conditions for obtaining a minimum value of the turn-off loss can be achieved by adjusting both differences.

EMBODIMENT 3

Next, a third embodiment having the same circuit arrangement as that of the first embodiment will be described with reference to FIGS. 9A, 9B and 9C.

In the third embodiment, the IGBT A and the IGBT B are integrally formed on a common substrate into a single chip. The circuit arrangement is identical to that of the first embodiment unless otherwise specified, and so the description thereof is omitted here. The third embodiment can be incorporated into a semiconductor integrated circuit.

Figure 9A:
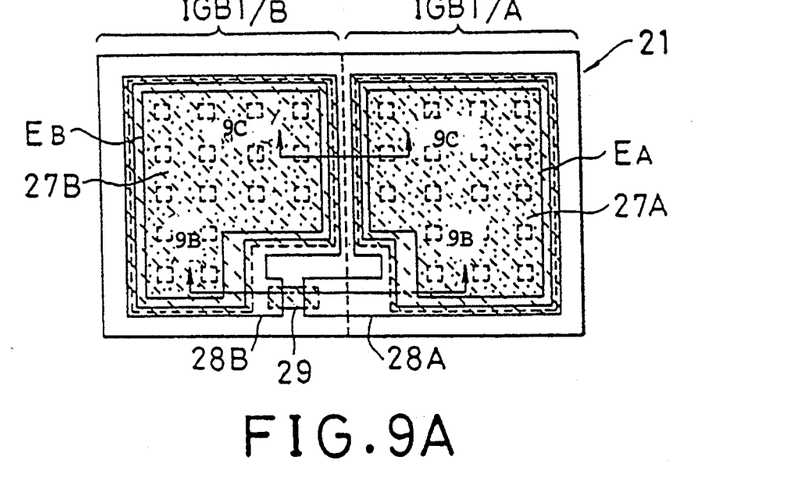
FIG. 9A is a plan view showing a chip construction of a third embodiment of a semiconductor switching device according to the present invention.
Figure 9B:
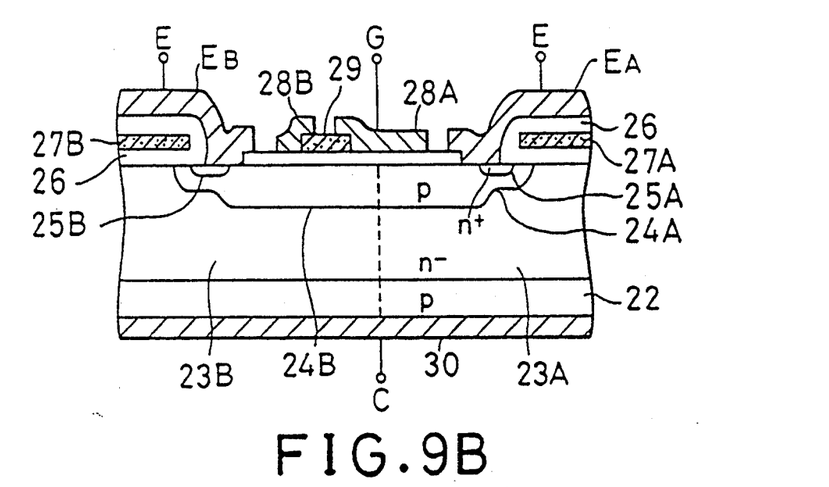
FIG. 9B is a partially enlarged cross-sectional view taken along the line 9B—9B of FIG. 9A.
Figure 9C:
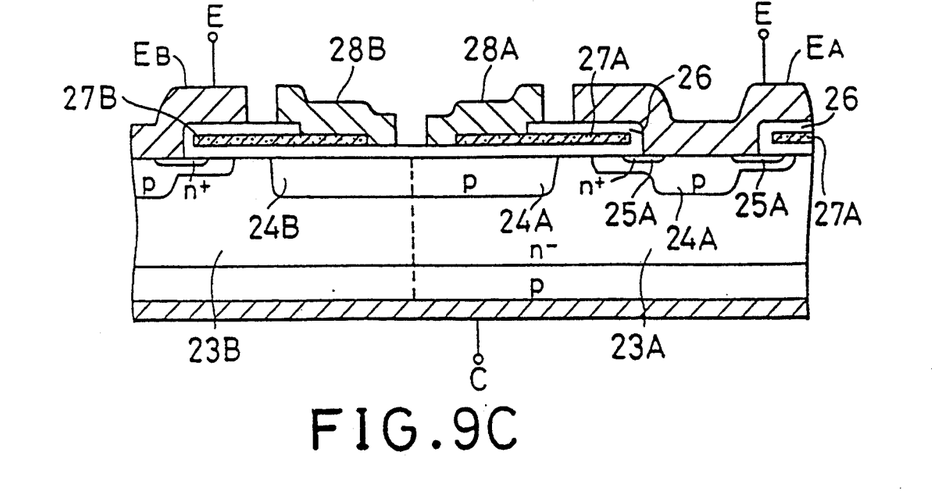
FIG. 9C is a partially enlarged cross-sectional view taken along the line 9C—9C of FIG. 9A.

FIGS. 9B and 9C are partially sectional enlarged views taken along lines 9B—9B and 9C—9C of FIG. 9A, respectively. The IGBTs A and B include a p collector layer 22, followed by n−base layers 23A and 23B. In the surface of the n−base layers 23A and 23B, p base layers 24A and 24B and n+ emitter layers 25A and 25B are embedded successively by the double diffusion process. On the surface of these, polysilicon gates 27A and 27B are deposited via a gate insulating layer 26. Subsequently, emitter electrodes Ea and Eb, which are made of aluminum and make ohmic contact with the p base layer 24A and the n+ emitter layer 25A, and with the p base layer 24B and the n+ emitter layer 25B, respectively, are formed to be connected to an emitter terminal E. The polysilicon gate 27A is connected to a gate electrode 28A, and the polysilicon gate 27B is connected to a gate electrode 28B. The gate electrode 28B is connected via a polysilicon resistance layer 29, to the gate electrode 28A which is connected to a gate terminal G. Finally, a collector electrode 30 is formed on the bottom surface of the p collector layer 22 to be connected to the collector terminal C.

The third embodiment is characterized in that the circuit arrangement of the first embodiment is incorporated into a single chip. Since the IGBTs A and B of the corresponding structure are formed on a common semiconductor substrate, almost all the processes except for processes needed to differentiate the characteristics of the two IGBTs can be made common, thus reducing the cost for fabricating the device. For example, an electrode wiring layer of the two IGBTs can be formed simultaneously, and the polysilicon gates 27A and 27B and the polysilicon resistance layer 29 can also be formed at the same time, independently of the characteristic control of the IGBTs.

In this embodiment, n−base layer 23B includes greater amount of lifetime killers like Au or Pt than the n−base layer 23A. In addition, the former was subjected to longer electron beam irradiation than the latter. As a result, the lifetime of the minority carrier of the IGBT B is made shorter than that of the IGBT A, resulting in a shorter fall time of the IGBT B. In this technique, the fall time can be controlled to some extent independently of the saturation time of the IGBTs A and B by controlling the lifetime after the saturation time is set by determining the structure, dimensions and carrier density of the IGBTs. Thus, setting ranges of the device characteristics widen, and controllability of the device is improved.

EMBODIMENT 4

Figure 10A:
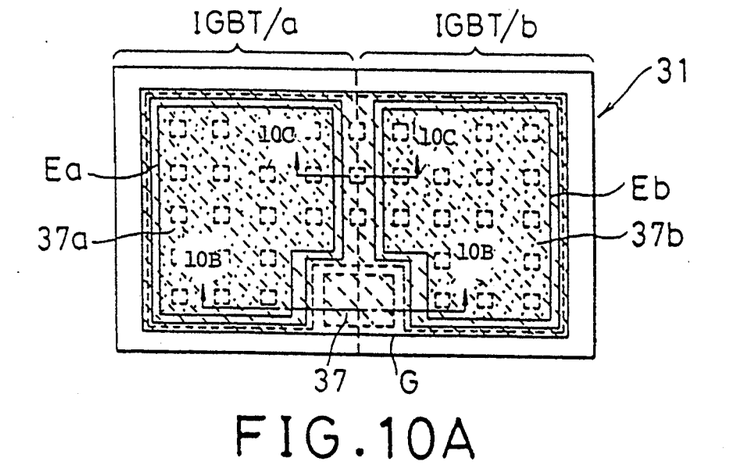
FIG. 10A is a plan view showing a chip construction of a fourth embodiment of a semiconductor switching device according to the present invention.
Figure 10B:
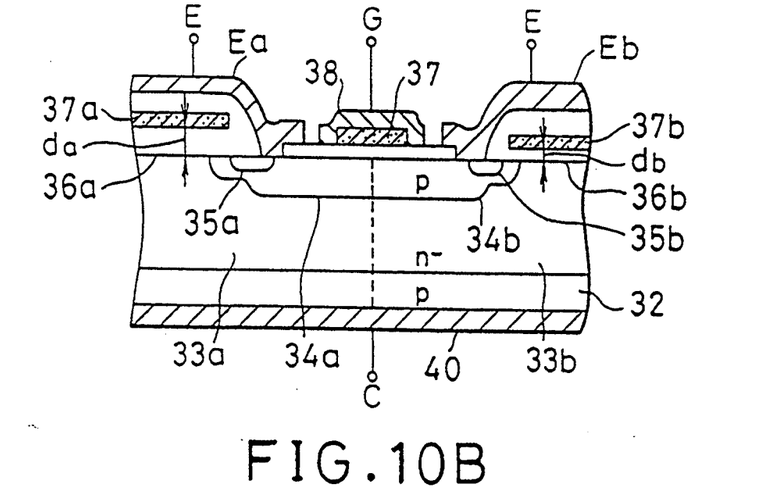
FIG. 10B is a partially enlarged cross-sectional view taken along the line 10B—10B of FIG. 10A.
Figure 10C:
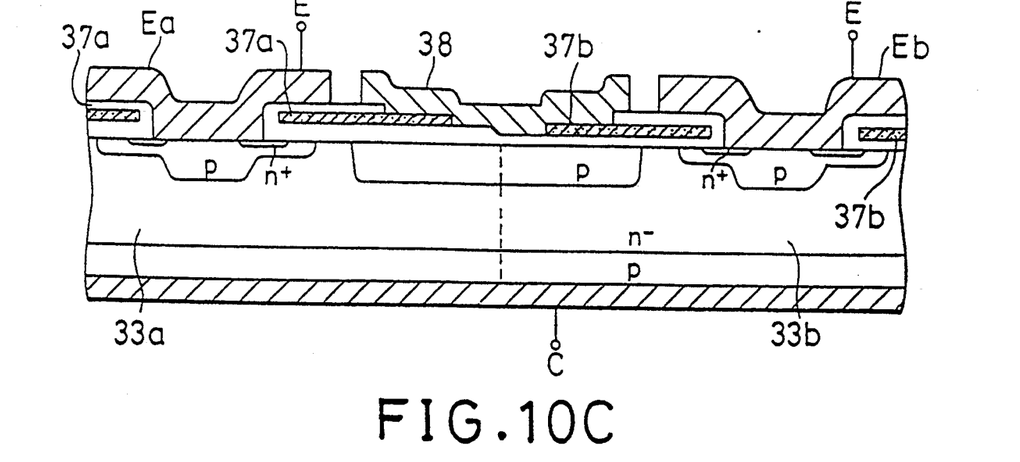
FIG. 10C is a partially enlarged cross-sectional view taken along the line 10C—10C of FIG. 10A.

Lastly, a fourth embodiment of the present invention will be described with reference to FIGS. 10A, 10B and 10C. FIG. 10A is a plan view of a semiconductor switching device of the fourth embodiment, and FIGS. 10B and 10C are a partially cross-sectional enlarged views taken along the lines 10B—10B and 10C—10C of FIG. 10A, respectively. This embodiment is a single-chip semiconductor switching device having the same circuit arrangement as that of the second embodiment as shown in FIG. 6, which is formed on a common substrate. Accordingly, repetitive explanation of the second embodiment will be omitted here.

IGBTs a and b comprise a p collector layer 32, followed by n−base layers 33a and 33b. In the surface of the n−base layers 33a and 33b, p base layers 34a and 34b and n+ emitter layers 35a and 35b are embedded successively by the double diffusion process. On the surface of these, polysilicon gates 37a and 37b are deposited via gate insulating layers 36a and 36b. Subsequently, emitter electrodes Ea and Eb, which are made of aluminum and make ohmic contact with the p base layer 34a and the n+ emitter 35a, and with the p base layer 34b and the n+ emitter layer 35b, respectively, are formed to be connected to an emitter terminal E. The polysilicon gates 37a and 37b are connected to a common polysilicon layer 37 which is connected to a common gate electrode 38.

Thus, values of input resistors Ra and Rb of the second embodiment are specified by internal resistances between the polysilicon gate 37a and the polysilicon layer 37, and the polysilicon gate 37b and the polysilicon layer 37, respectively. The gate electrode 38 is connected to a gate terminal G, and a collector electrode 40 is formed on the bottom surface of the p collector layer 32 to be connected to a collector terminal C. In this embodiment as in the third embodiment, n−base layer 33b includes greater amount of lifetime killers like Au or Pt than the n−base layer 33a. In addition, the n−layer 33b was subjected to longer electron beam irradiation than the n−layer 33a.

In this embodiment, the thickness da of the gate insulating layer 36a formed immediately under the polysilicon gate 37a is made greater than the thickness db of the gate insulating layer 36b formed immediately under the polysilicon gate 37b so that the gate capacitance of the IGBT b is made greater than that of the IGBT a. Accordingly, during the on/off driving, the gate input charge quantity of the IGBT b is greater than that of the IGBT a, thus achieving the same effect as that of the second embodiment.

With this construction, effect similar to that of the third embodiment can be obtained in the fabrication process. Furthermore, it is unnecessary to form asymmetric planar structure as in the third embodiment. In addition, freedom in determining the values of the input resistors is increased so that a minimum value of the switching loss can be realized with a more free planar pattern by adjusting the difference between the input resistors Ra and Rb and the difference between the gate input charge quantities.

The present invention has been described in detail with respect to various embodiments, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. A semiconductor switching device comprising:
   a first semiconductor element having an input electrode, an output electrode, and a control electrode to which a drive signal is applied for connecting the input electrode to the output electrode or for disconnecting the output electrode from the input electrode, the first semiconductor element having a first saturation voltage and a first fall time;
   a second semiconductor element having an input electrode, an output electrode and a control electrode to which the drive signal is applied, the input and output electrodes being coupled to the input and output electrodes, respectively, of the first semiconductor element, said second semiconductor element being of the same type semiconductor device as said first semiconductor element, and having a second saturation voltage and a second fall time, the second saturation voltage being greater than the first saturation voltage and the second fall time being shorter than the first fall time; and drive signal delay means for delaying the drive signal applied to the control electrode of said second semiconductor element by a predetermined amount with respect to the drive signal applied to the control electrode of said first semiconductor element.

2. A semiconductor switching device as claimed in claim 1, wherein said drive signal delay means includes a first input resistor coupled to the control electrode of said second semiconductor element, said first input resistor having a larger resistance than a second input resistor coupled to the control electrode of said first semiconductor element.

3. A semiconductor switching device as claimed in claim 1, wherein said drive signal delay means provides a first input charge quantity associated with the control electrode of said second semiconductor element and a second input charge quantity associated with the control electrode of the first semiconductor element, said first input charge quantity being greater than the second input charge quantity.

4. A semiconductor switching device as claimed in claim 1, wherein said first semiconductor element and said second semiconductor element each have a respective active device area formed on a common semiconductor substrate, and a resistance layer coupled between the respective control electrodes.

5. A semiconductor switching device as claimed in claim 1, wherein said first and second semiconductor elements are each an IGBT.

6. A semiconductor switching device as claimed in claim 1, wherein said first and second semiconductor elements are each a bipolar transistor.

7. A semiconductor switching device as claimed in claim 1, wherein said first and second semiconductor elements are each a MOSFET.

8. A semiconductor switching device as claimed in claim 4, wherein said first and second semiconductor elements are each an IGBT.

9. A semiconductor switching device as claimed in claim 8, wherein said first semiconductor element comprises a first insulating layer area having a first thickness formed under the control electrode of the first semiconductor element, and said second semiconductor element comprises a second insulating layer area having a second thickness formed under the control electrode of the second semiconductor element, and wherein the first thickness of the first insulating layer area of said first semiconductor element is greater than the second thickness of the second insulating layer area of said second semiconductor element.

10. A semiconductor switching device as claimed in claim 9, wherein the active device area of said second semiconductor element is subjected to minority carrier lifetime shortening process for a longer duration than the active device area of said first semiconductor element.

* * * * *